United States Patent
Lee et al.

(10) Patent No.: US 11,568,120 B2
(45) Date of Patent: Jan. 31, 2023

(54) APPARATUS AND METHOD FOR DETERMINING MOUNTING INFORMATION, AND RECORDING MEDIUM FOR STORING INSTRUCTION

(71) Applicant: KOH YOUNG TECHNOLOGY INC., Seoul (KR)

(72) Inventors: Duk Young Lee, Suwon-si (KR); Jun Ho Lee, Seoul (KR); Jae Hwan Lee, Seoul (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 204 days.

(21) Appl. No.: 17/201,667

(22) Filed: Mar. 15, 2021

(65) Prior Publication Data
US 2022/0138393 A1 May 5, 2022

(30) Foreign Application Priority Data
Nov. 2, 2020 (KR) .................. 10-2020-0144265

(51) Int. Cl.
*G06F 30/39* (2020.01)
*G06F 30/392* (2020.01)
(Continued)

(52) U.S. Cl.
CPC ......... *G06F 30/392* (2020.01); *H05K 3/0008* (2013.01); *H05K 3/341* (2013.01); *G06F 30/398* (2020.01)

(58) Field of Classification Search
CPC ... G06F 30/392; G06F 30/398; H05K 3/0008; H05K 3/341; H05K 13/083;
(Continued)

(56) References Cited

U.S. PATENT DOCUMENTS

| | | | |
|---|---|---|---|
| 2020/0221615 A1* | 7/2020 | Hatzilias | ............... H05K 3/341 |
| 2021/0105920 A1 | 4/2021 | Lee et al. | |
| 2021/0404973 A1 | 12/2021 | Lee et al. | |

FOREIGN PATENT DOCUMENTS

| | | |
|---|---|---|
| JP | 6248046 | 12/2017 |
| KR | 10-2017-0096775 | 8/2017 |

(Continued)

OTHER PUBLICATIONS

Korean Office Action with English translation for Korean Patent Application No. 10-2020-0144265 dated Dec. 28, 2021.
(Continued)

*Primary Examiner* — Paul Dinh
(74) *Attorney, Agent, or Firm* — Kile Park Reed & Houtteman PLLC

(57) ABSTRACT

The apparatus according to various embodiments includes one or more processors, and one or more memories operatively connected to the one or more processors. The one or more memories may store instructions that, when executed, cause the one or more processors to acquire a plurality of first position offsets of a plurality of first components respectively mounted on a plurality of first substrates with respect to a plurality of pads of the plurality of first substrates corresponding to the plurality of first components from the optical measurement device, set a range of a normal state for a component position offset based on the plurality of first position offsets, generate a control signal for adjusting at least one control parameter of the component mounting device associated with a component mounting position based on the range of the normal state, and transmit the control signal to the component mounting device.

20 Claims, 7 Drawing Sheets

(51) Int. Cl.
    *H05K 3/00*         (2006.01)
    *H05K 3/34*         (2006.01)
    *G06F 30/398*     (2020.01)

(58) Field of Classification Search
    CPC ........... H05K 13/0815; H05K 13/0465; H05K 13/0813; H05K 13/0413
    USPC ........................................................ 716/119
    See application file for complete search history.

(56) References Cited

FOREIGN PATENT DOCUMENTS

| KR | 10-2020-0002000 | 1/2020 |
| KR | 10-2020-0063079 | 6/2020 |
| WO | 2014/080502 | 5/2014 |

OTHER PUBLICATIONS

Extended European Search Report for European Application No./Patent No. 21163897.8, dated Sep. 16, 2021.

* cited by examiner

APPARATUS AND METHOD FOR DETERMINING MOUNTING INFORMATION, AND RECORDING MEDIUM FOR STORING INSTRUCTION

CROSS-REFERENCE TO RELATED APPLICATION

This application is based upon and claims the benefit of priority from Korean Patent Application No. 10-2020-0144265, filed on Nov. 2, 2020, the entire contents of which are incorporated herein by reference.

TECHNICAL FIELD

The present disclosure relates to a technique for determining mounting information.

The present disclosure is derived from research conducted as part of the 'Smart Manufacturing R&D' project of the Korea Industrial Complex Corporation [Project identification number: 1415166035, Research title: Development of real-time smart solution for electronic assembly process (SMT)]

BACKGROUND

Components may be mounted on a solder-printed substrate (e.g., a printed circuit board) by various surface mount techniques (SMT). The substrate on which components are mounted may undergo a reflow process. The mounted components may finally be bonded to the substrate during this process. In the substrate that has undergone the reflow process, it is required to appropriately determine the mounting position of a component so that the bonded component can smoothly make contact with pads (electrodes) of the substrate. If the component is not in good contact with the pads due to incorrect mounting, it may cause a defect in the substrate.

SUMMARY

Various embodiments of the present disclosure provide a technique for determining mounting information such as a mounting position of a component, and the like.

According to various embodiments of the present disclosure, an apparatus configured to communicate with a component mounting device for mounting at least one component on at least one pad of each of a plurality of substrates and an optical measurement device for measuring positions of the at least one component mounted on each of the plurality of substrates transferred from the component mounting device, includes: one or more processors; and one or more memories operatively connected to the one or more processors, wherein the one or more memories may store instructions that, when executed, cause the one or more processors to acquire a plurality of first position offsets of a plurality of components respectively mounted on a plurality of first substrates with respect to a plurality of pads of the plurality of first substrates corresponding to the plurality of components from the optical measurement device, set a range of a normal state for a component position offset based on the plurality of first position offsets, generate a control signal for adjusting at least one control parameter of the component mounting device associated with a component mounting position based on the range of the normal state, and transmit the control signal to the component mounting device.

According to various embodiments of the present disclosure, the instructions may be configured to cause the one or more processors to, after transmitting the control signal, acquire a plurality of second position offsets of a plurality of second components respectively mounted on a plurality of second substrates with respect to a plurality of pads of the plurality of second substrates corresponding to the plurality of second components from the optical measurement device, and determine whether or not a change in a state of the component position offset has occurred, based on the plurality of second position offsets and the range of the normal state set based on the plurality of first position offsets.

According to various embodiments of the present disclosure, the instructions may be configured to cause the one or more processors to, in response to a determination that a change in the state of the component position offset has occurred, reset the range of the normal state for the component position offset based on the plurality of second position offsets.

According to various embodiments of the present disclosure, the instructions may be configured to cause the one or more processors to regenerate a control signal for re-adjusting the at least one control parameter of the component mounting device associated with the component mounting position based on the reset range of the normal state, and transmit the regenerated control signal to the component mounting device.

According to various embodiments of the present disclosure, the instructions may be configured to cause the one or more processors to check a number of offsets falling outside the range of the normal state among the plurality of second position offsets, and determine that a change in the state of the component position offset has occurred, when the number of offsets falling outside the range of the normal state exceeds a predetermined number.

According to various embodiments of the present disclosure, the instructions may be configured to cause the one or more processors to, after transmitting the control signal, acquire a third position offset of a third component mounted on a third substrate with respect to a pad of the third substrate from the optical measurement device, regenerate a control signal for re-adjusting the at least one control parameter of the component mounting device based on the range of the normal state and the third position offset, and transmit the regenerated control signal to the component mounting device.

According to various embodiments of the present disclosure, the at least one control parameter of the component mounting device may include at least one of a control parameter for adjusting an insertion position of the component mounting device in a width direction, a control parameter for adjusting an insertion position of the component mounting device in a longitudinal direction, and a control parameter for adjusting an insertion angle of the component mounting device.

According to various embodiments of the present disclosure, the apparatus may further include: a communication circuit configured to communicate with the component mounting device and the optical measurement device.

According to various embodiments of the present disclosure, a method performed by an apparatus configured to communicate with a component mounting device for mounting at least one component on at least one pad of each of a plurality of substrates and an optical measurement device for measuring positions of the at least one component mounted on each of the plurality of substrates transferred from the component mounting device, includes: acquiring a plurality of first position offsets of a plurality of first components respectively mounted on a plurality of first substrates with respect to a plurality of pads of the plurality of first substrates corresponding to the plurality of first components from the optical measurement device; setting a range of a normal state for a component position offset based on the plurality of first position offsets; generating a control signal for adjusting at least one control parameter of the component mounting device associated with a component mounting position based on the range of the normal state; and transmitting the control signal to the component mounting device.

The method according to various embodiments of the present disclosure may further include: acquiring, after transmitting the control signal, a plurality of second position offsets of a plurality of second components respectively mounted on a plurality of second substrates with respect to a plurality of pads of the plurality of second substrates corresponding to the plurality of second components from the optical measurement device; and determining whether or not a change in the state of the component position offset has occurred, based on the plurality of second position offsets and the range of the normal state set based on the plurality of first position offsets.

The method according to various embodiments of the present disclosure may further include: in response to a determination that a change in the state of the component position offset has occurred, resetting the range of the normal state for the component position offset based on the plurality of second position offsets.

The method according to various embodiments of the present disclosure may further include: regenerating a control signal for re-adjusting the at least one control parameter of the component mounting device associated with the mounting positions of the components based on the reset range of the normal state; and transmitting the regenerated control signal to the component mounting device.

According to various embodiments of the present disclosure, the operation of determining may include: checking a number of offsets falling outside the range of the normal state among the plurality of second position offsets; and determining that a change in the state of the component position offset has occurred, when the number of offsets falling outside the range of the normal state exceeds a predetermined number.

The method according to various embodiments of the present disclosure may further include: after transmitting the control signal, acquiring a third position offset of a third component mounted on a third substrate with respect to a pad of the third substrate from the optical measurement device; regenerating a control signal for re-adjusting the at least one control parameter of the component mounting device based on the range of the normal state and the third position offset; and transmitting the regenerated control signal to the component mounting device.

According to various embodiments of the present disclosure, the at least one control parameter of the component mounting device may include at least one of a control parameter for adjusting an insertion position of the component mounting device in a width direction, a control parameter for adjusting an insertion position of the component mounting device in a longitudinal direction, and a control parameter for adjusting an insertion angle of the component mounting device.

According to various embodiments of the present disclosure, there is provided a non-transitory computer-readable recording medium that records instructions for causing one or more processors to, when the instructions are executed by the one or more processors, perform an operation of communicating with a component mounting device for mounting at least one component on at least one pad of each of a plurality of substrates and an optical measurement device for measuring positions of the at least one component mounted on each of the plurality of substrates transferred from the component mounting device, wherein the instructions are configured to cause the one or more processors to: acquire a plurality of first position offsets of a plurality of components respectively mounted on a plurality of first substrates with respect to a plurality of pads of the plurality of first substrates corresponding to the plurality of components from the optical measurement device; set a range of a normal state for a component position offset based on the plurality of first position offsets; generate a control signal for adjusting at least one control parameter of the component mounting device associated with a component mounting position based on the range of the normal state; and transmit the control signal to the component mounting device.

According to various embodiments of the present disclosure, the instructions may be configured to cause the one or more processors to, acquire, after transmitting the control signal, a plurality of second position offsets of a plurality of second components respectively mounted on a plurality of second substrates with respect to a plurality of pads of each of the plurality of second substrates corresponding to the plurality of second components from the optical measurement device, and determine whether or not a change in a state of the component position offset has occurred, based on the plurality of second position offsets and the range of the normal state set based on the plurality of first position offsets.

According to various embodiments of the present disclosure, the instructions may be configured to cause the one or more processors to, in response to a determination that a change in the state of the component position offset has occurred, reset the range of the normal state for the component position offset based on the plurality of second position offsets.

According to various embodiments of the present disclosure, the instructions may be configured to cause the one or more processors to regenerate a control signal for re-adjusting the at least one control parameter of the component mounting device associated with the component mounting position based on the reset range of the normal state, and transmit the regenerated control signal to the component mounting device.

According to various embodiments of the present disclosure, the instructions may be configured to cause the one or more processors to check a number of offsets falling outside the range of the normal state among the plurality of second position offsets, and determine that a change in the state of the component position offset has occurred, when the number of offsets falling outside the range of the normal state exceeds a predetermined number.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
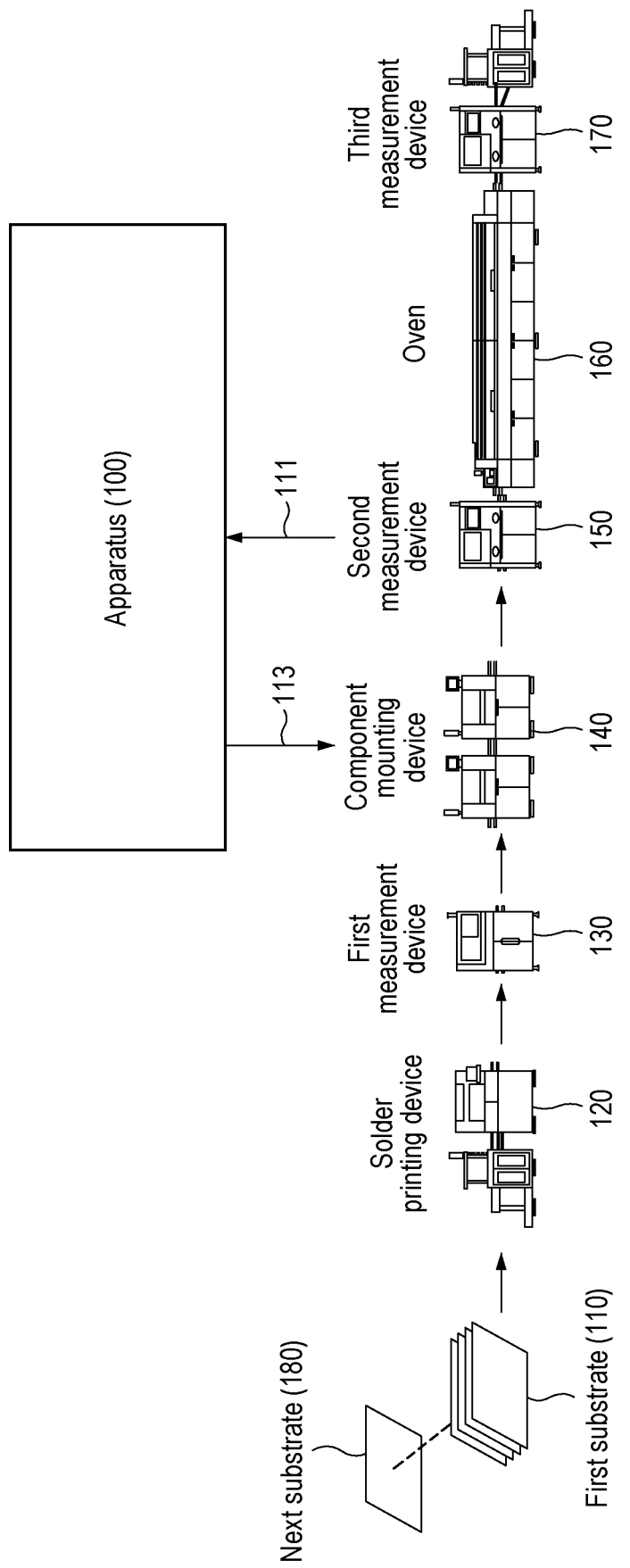
FIG. 1 is a diagram illustrating an operation process of an apparatus for determining mounting information according to various embodiments of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

The various embodiments described herein are exemplified for the purpose of clearly describing the technical idea of the present disclosure, and are not intended to limit the technical idea of the present disclosure to specific embodiments. The technical idea of the present disclosure includes various modifications, equivalents, alternatives of each of the embodiments described in this document, and embodiments selectively combined from all or part of the respective embodiments. In addition, the scope of the technical idea of the present disclosure is not limited to the various embodiments or detailed descriptions thereof presented below.

The terms used herein, including technical or scientific terms, may have meanings that are generally understood by a person having ordinary knowledge in the art to which the present disclosure pertains, unless otherwise specified.

As used herein, expressions such as "include", "may include", "provided with", "may be provided with", "have", and "may have" mean the presence of subject features (e.g., functions, operations, components, etc.) and does not exclude the presence of other additional features. That is, such expressions should be understood as open-ended terms that imply the possibility of including other embodiments.

A singular expression may include the plural meaning, unless otherwise mentioned, and the same is applicable to a singular expression stated in the claims.

The terms "first", "second", etc. used herein are used to identify a plurality of components from one another, and are not intended to limit the order or importance of the relevant components.

As used herein, expressions such as "A, B and C", "A, B or C", "A, B and/or C", "at least one of A, B and C", "at least one of A, B or C", "at least one of A, B and/or C", "at least one selected from A, B and C", "at least one selected from A, B or C", and "at least one selected from A, B and/or C" may mean each one of the listed items or all available combinations of the listed items. For example, the expression "at least one selected from A and B" may refer to (1) A, (2) at least one of A, (3) B, (4) at least one of B, (5) at least one of A and at least one of B, (6) at least one of A and B, (7) at least one of B and A, and (8) both A and B.

The expression "based on" used herein is used to describe one or more factors that influences a decision, an action of judgment or an operation described in a phrase or sentence including the relevant expression, and this expression does not exclude additional factors influencing the decision, the action of judgment or the operation.

As used herein, the expression that a certain component (e.g., a first component) is "connected" to another component (e.g., a second component) may mean that the certain component is connected to another component either directly or via a new further component (e.g., a third component).

As used herein, the expression "configured to" may have a meaning such as "set to", "having the ability to", "modified to", "made to", "capable of", or the like depending on the context. The expression is not limited to the meaning of "specially designed in hardware". For example, a processor configured to perform a specific operation may mean a generic-purpose processor capable of performing a specific operation by executing software.

In order to describe various embodiments of the present disclosure, a Cartesian coordinate system having an X axis, a Y axis and a Z axis orthogonal to each other may be defined. As used herein, the expression such as "X-axis direction", "Y-axis direction" or "Z-axis direction" of the Cartesian coordinate system may refer to both directions in which each axis of the Cartesian coordinate system extends, unless specifically defined otherwise in the corresponding description. In addition, the + sign in front of each axis direction may mean a positive direction, which is one of the two directions that extend along the corresponding axis, and the sign in front of each axis direction may mean a negative direction, which is the other of the two directions that extend along the corresponding axis.

In the present disclosure, a substrate is a plate or container on which elements such as semiconductor chips or the like are mounted, and may serve as a path for transmitting electrical signals between elements. The substrate may be used for fabricating an integrated circuit or the like, and may be made of a material such as silicon or the like. For example, the substrate may be a printed circuit board (PCB), and may also be referred to as a wafer.

Hereinafter, various embodiments of the present disclosure will be described with reference to the accompanying drawings. In the accompanying drawings and the descriptions of the drawings, the same reference numerals may be assigned to the same or substantially equivalent elements. Furthermore, in the following description of various embodiments, the duplicative description of the same or corresponding elements may be omitted. However, this does not mean that the elements are not included in the embodiments.

FIG. 1 is a diagram illustrating an operation process of an apparatus 100 for determining mounting information according to various embodiments of the present disclosure. The apparatus 100 according to the present disclosure may determine the mounting information for mounting a component on a substrate based on the information acquired in a substrate processing process. The apparatus 100 may determine mounting information for mounting a component on a substrate based on the information acquired from a second measurement device 150.

According to various embodiments, a substrate processing process may be performed on one or more substrates in turn. The substrate processing process may be a process of mounting and bonding a component to a substrate according to the surface mounting technology. In the substrate processing process, a solder printing device 120, a first measurement device 130, a component mounting device 140, a second measurement device 150, an oven 160 and/or a third measurement device 170 may be used. In the substrate processing process, the solder printing device 120 may print solder on the substrate. The first measurement device 130 may measure the state of the solder printed on the substrate. The component mounting device 140 may mount a component on the substrate on which the solder is printed. The second measurement device 150 may measure the state of the mounted component. The substrate on which the component is mounted may be fed into the oven 160 and may undergo a reflow process. During the reflow process, the solder is melted and then cured again, thereby allowing the component to be bonded to the substrate. The third measurement device 170 may measure the state of the component on the substrate after the reflow process. The second measurement device 150 and the third measurement device 170 may be optical measurement devices that measure the state of the component by optically taking an image of the mounted component. The second measurement device 150 and the third measurement device 170 may be, for example, auto optical inspection (AOI) devices.

According to the present disclosure, a substrate processing process may be performed on a plurality of substrates (hereinafter referred to as "a plurality of first substrates 110") for which mounting information is determined. The solder printing device 120 may print solders on the plurality of first substrates 110. The solder printing device 120 may be referred to as a screen printer. A plurality of pads may be provided on the plurality of first substrates 110, respectively. The solder printing device 120 may print solder on each of the plurality of pads of the plurality of first substrates 110. In the present disclosure, the plurality of pads may indicate a pair of electrodes provided at a position where a component is to be bonded to the substrate. One component may be mounted and bonded to one pad (a pair of electrodes) provided on the substrate.

The first measurement device 130 according to various embodiments may measure the state of the solder printed on each of the plurality of first substrates 110. The first measurement device 130 may be referred to as a solder paste inspection (SPI) device. In the present disclosure, the state of the solder may include at least one selected from position, orientation, volume, height and area of the corresponding solder. In this regard, the position of the solder may indicate an absolute position (e.g., coordinates, etc.) on the substrate or a relative position (e.g., a position offset) from the center of the pad associated with the solder.

The component mounting device 140 according to various embodiments may receive the mounting information indicating a mounting condition for mounting a plurality of first components on the plurality of first substrates 110 from the apparatus 100, and may mount the plurality of first components on the plurality of first substrates 110 based on the mounting condition indicated by the received mounting information. The mounting information may be information that indicates a mounting condition for mounting the corresponding component on the next substrate. For example, the mounting information may be a control signal for adjusting at least one control parameter of the component mounting device 140 associated with the mounting position of the component.

The second measurement device 150 may measure the state of the component mounted according to the mounting information, that is, the state of the component before the reflow process for the plurality of first substrates 110. The second measurement device 150 may be an optical measurement device and may be referred to as, for example, pre-AOI (automated optical inspection) device. The second measurement device 150 may output previous component measurement information 111 that indicates the measured state of the component before the reflow process for the plurality of first substrates 110. In the present disclosure, the state of the component may indicate the position and/or orientation of the component placed on the substrate. In this regard, the position of the component may be an absolute position (e.g. coordinates, etc.) on the substrate, a relative position (e.g., a position offset) from the center of the pad associated with the corresponding component, or a relative position (e.g., a position offset) from the center of the solder associated with the corresponding component. In this regard, the orientation of the component is an angle of the corresponding component with respect to the substrate, and may include an angle in a yaw, pitch and/or roll direction. For example, the second measurement device 150 may output a plurality of first position offsets of the plurality of first components respectively mounted on the plurality of first substrates 110 with respect to the plurality of pads of the plurality of first substrates corresponding to the plurality of first components.

According to various embodiments, the plurality of first substrates 110 on which the plurality of components are mounted may be fed into the oven 160 and may undergo a reflow process. The solder may be melted and then cured again through the reflow process. Accordingly, the plurality of components may be bonded to the plurality of first substrates 110. If the plurality of first substrates 110 has successfully undergone the substrate processing process as the mounting information is properly determined, the plurality of components may be bonded to the corresponding pads on the plurality of first substrates 110. The third measurement device 170 may measure the states of the plurality of first components on the plurality of first substrates 110 after the reflow process. The third measurement device 170 may be referred to as a post-AOI (automated optical inspection) device.

The second measurement device 150 according to various embodiments of the present disclosure may output a plurality of position offsets of the components mounted on the plurality of first substrates 110 with respect to the pads of the plurality of first substrates 110 corresponding to the components. The apparatus 100 may acquire the plurality of first position offsets from the second measurement device 150.

The apparatus 100 according to various embodiments may set a range of a normal state (or steady state) for a component position offset based on the plurality of first position offsets thus acquired. The range of the normal state for the component position offset may be, for example, a position-offset-related range in which the mounting positions of the components can be determined to be normal. For example, the apparatus 100 may determine the range of the normal state based on the standard deviation value of the plurality of first position offsets. For example, the apparatus 100 may determine the range of the normal state based on a maximum value and a minimum value among the plurality of first position offsets. For example, the apparatus 100 may determine the range of the normal state based on the offsets excluding the maximum and minimum values among the plurality of first position offsets. Other various methods for determining the range of the normal state may be applied.

The apparatus 100 according to various embodiments of the present disclosure may determine mounting information based on the range of the normal state thus set. The mounting information may be information indicating a mounting condition for mounting the component on the next substrate. For example, the apparatus 100 may generate a control signal for adjusting at least one control parameter of the component mounting device 140 associated with a component mounting position based on the set range of the normal state. The control parameter may be a parameter for controlling the component mounting device 140 so that the position offset of the component to be mounted on the next substrate falls within the set range of the normal state. The control parameter may include, for example, at least one of a control parameter for adjusting the insertion position of the component mounting device 140 in the width direction, a control parameter for adjusting the insertion position of the component mounting device 140 in the longitudinal direction, and a control parameter for adjusting the insertion angle of the component mounting device 140.

The apparatus 100 according to various embodiments may transmit the generated control signal 113 to the component mounting device 140. The component mounting device 140 may be referred to as a mounter. The component mounting device 140 may mount a component on a next substrate 180 that undergoes a substrate processing process after the plurality of first substrates 110, based on the corresponding control signal. In the aforementioned case, by determining the mounting position of the component based on the set range of the normal state, it is possible to optimize the mounting position of the component to be mounted on the next substrate 180.

The second measurement device 150 according to various embodiments may output a position offset of the component mounted on the substrate 180 with respect to the pad of the substrate 180 after the component is mounted on the substrate 180. The apparatus 100 may acquire the position offset of the component mounted on the substrate 180 with respect to the pad of the substrate 180, from the second measurement device 150. The apparatus 100 may generate a control signal for adjusting at least one control parameter of the component mounting device 140, based on the set range of the normal state and the acquired position offset, and may transmit the control signal to the component mounting device 140. For example, the apparatus 100 may determine the mounting position for the component to be mounted on the next substrate 180, using the set range of the normal state and the position offset of the component acquired by taking an image of the previous substrate, and may generate a control signal for adjusting at least one control parameter to mount the components at the mounting position thus determined. In the aforementioned case, the component mounting device 140 may mount a component at an optimal mounting position for each substrate. The optimal mounting position may indicate, for example, a position at which an error between a component mounting position intended by a user and an actual mounting position is minimized. The optimal mounting position may indicate, for example, a mounting position at which the position offset of the component with respect to the pads on the substrate is minimized after the reflow process for the substrate.

Figure 2:
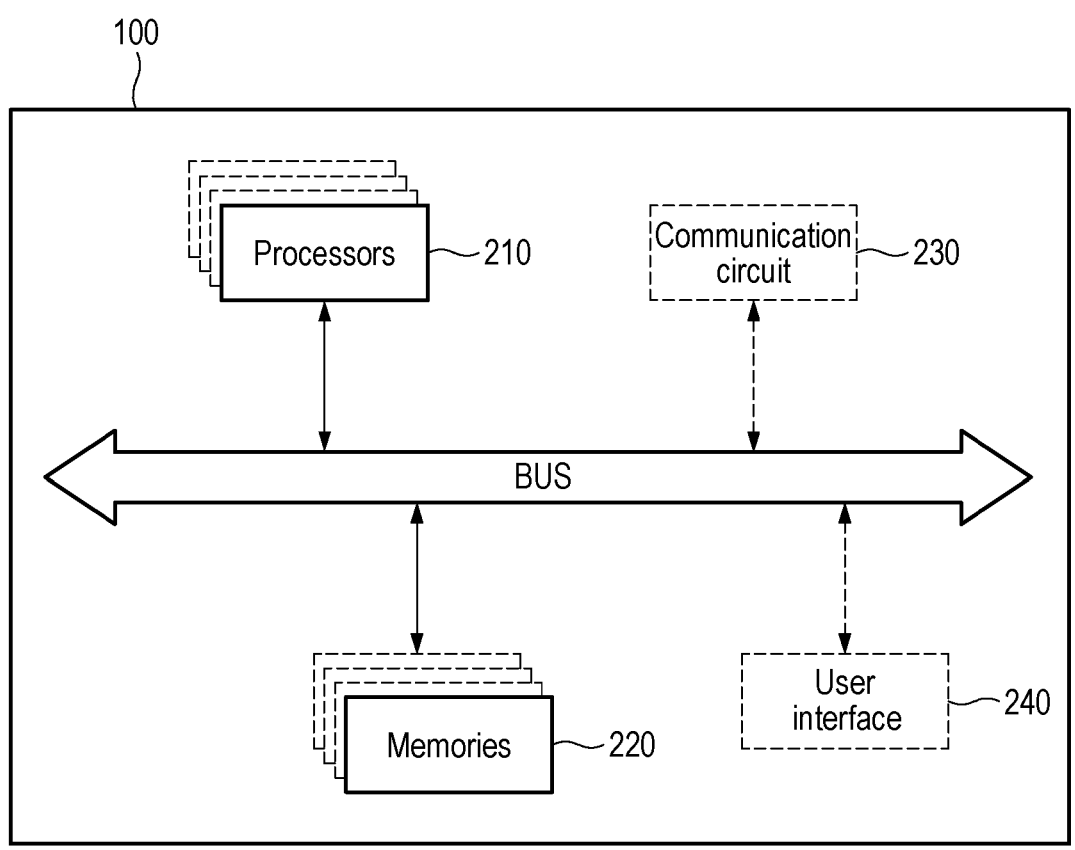
FIG. 2 is a block diagram of the apparatus according to various embodiments of the present disclosure.

FIG. 2 is a block diagram of the apparatus 100 according to various embodiments of the present disclosure. According to various embodiments, the apparatus 100 may include one or more processors 210 and/or one or more memories 220.

In one embodiment, at least one of these components of the apparatus 100 may be omitted, or another component may be added to the apparatus 100. In one embodiment, additionally or alternatively, some components may be integrated, or may be implemented as a single entity or plural entities. In the present disclosure, one or more processors 210 may be expressed as processor 210. The expression "processor 210" may indicate a set of one or more processors, unless clearly expressed otherwise in context. In the present disclosure, one or more memories 220 may be referred to as memory 220. The expression "memory 220" may indicate a set of one or more memories, unless clearly expressed otherwise in context. In one embodiment, at least some of the internal and external components of the apparatus 100 may be connected to each other via a bus, a general purpose input/output (GPIO), a serial peripheral interface (SPI), a mobile industry processor interface (MIPI) and the like to exchange data and/or signals.

The processor 210 according to various embodiments may control at least one component of the apparatus 100 connected to the processor 210 by driving software (e.g., instructions, programs, etc.). Furthermore, the processor 210 may perform various operations related to the present disclosure, such as calculation, treatment, data generation, processing and the like. In addition, the processor 210 may load data or the like from the memory 220 or store the data in the memory 220.

The memory 220 according to various embodiments may store various types of data. The data stored in the memory 220 is acquired, processed or used by at least one component of the apparatus 100, and may include software (e.g., instructions, programs, etc.). The memory 220 may include a volatile and/or nonvolatile memory. In the present disclosure, instructions or programs are software stored in the memory 220, and may include an operating system for controlling the resources of the apparatus 100, an application, and/or middleware that provides various functions to the application so that the application can utilize the resources of the apparatus 100. In one embodiment, the memory 220 may store instructions that, when executed by the processor 210, cause the processor 210 to perform calculation. In one embodiment, the memory 220 may store solder measurement information, mounting information, information related to the first component, information related to the first substrates 110, and the like.

According to various embodiments, the apparatus 100 may further include a communication circuit 230. The communication circuit 230 may perform wireless or wired communication between the apparatus 100 and a server, or between the apparatus 100 and other devices. For example, the communication circuit 230 may perform wireless communication according to a method such as eMBB (enhanced Mobile Broadband), URLLC (Ultra Reliable Low-Latency Communication), MMTC (Massive Machine Type Communication), LTE (Long-Term Evolution), LTE-A (LTE Advance), NR (New Radio), UMTS (Universal Mobile Telecommunications System), GSM (Global System for Mobile Communication), CDMA (Code Division Multiple Access), WCDMA (Wideband CDMA), WiBro (Wireless Broadband), WiFi (Wireless Fidelity), Bluetooth, NFC (Near Field Communication), GPS (Global Positioning System), or GNSS (Global Navigation Satellite System). For example, the communication circuit 230 may perform wired communication according to a method such as USB (Universal Serial Bus), HDMI (High Definition Multimedia Interface), RS-232 (Recommended Standard-232), or POTS (Plain Old Telephone Service). In one embodiment, the communication circuit 230 may make communication with the solder printing device 120, the first measurement device 130, the component mounting device 140, the second measurement device 150, the oven 160 and/or the third measurement device 170.

According to various embodiments, the processor 210 may control the communication circuit 230 to acquire information necessary for determining mounting information from the server according to the present disclosure. The information acquired from the server may be stored in the memory 220.

According to various embodiments, the apparatus 100 may exist in a form combined with at least one of the solder printing device 120, the first measurement device 130, the component mounting device 140, the second measurement device 150, the oven 160 and/or the third measurement device 170, or may exist as a separate apparatus. When the apparatus 100 exists in a form combined with at least one of the above-described devices (e.g., the component mounting device 140), the apparatus 100 may directly exchange various kinds of information with the corresponding device (e.g., the component mounting device 140) without going through the communication circuit 230.

According to various embodiments, the apparatus 100 may further include a user interface 240. The user interface 240 may receive an input from a user and may output (display) information to the user. The user interface 240 may include an input device and/or an output device. The input device may be a device that receives information, which is to be transmitted to at least one component of the apparatus 100, from the outside. For example, the input device may include a mouse, a keyboard, a touch pad and the like. The output device may be a device that provides various kinds of information on the apparatus 100 to a user in a visual/audible form. For example, the output device may include a display, a projector, a hologram, a speaker and the like. In one embodiment, the user interface 240 may receive information for controlling the apparatus 100, information for controlling a substrate processing process, information about the first substrates 110, information about the first component, and the like from the user. In one embodiment, the user interface 240 may display the determined mounting information or the like to the user.

According to various embodiments, the apparatus 100 may be an apparatus of various types. For example, the apparatus 100 may be a portable communication apparatus, a computer apparatus, a wearable apparatus, or a combination of two or more of the aforementioned apparatuses. However, the apparatus 100 of the present disclosure is not limited to the aforementioned apparatuses.

Various embodiments of the apparatus 100 presented in the present disclosure may be combined with each other. The respective embodiments may be combined according to the number of cases, and the embodiments of the apparatus 100 made by such combination also fall within the scope of the present disclosure. In addition, the internal/external components of the apparatus 100 according to the present disclosure described above may be added, modified, replaced or deleted depending on the embodiments. In addition, the internal/external components of the apparatus 100 described above may be implemented as hardware components.

Figure 3:
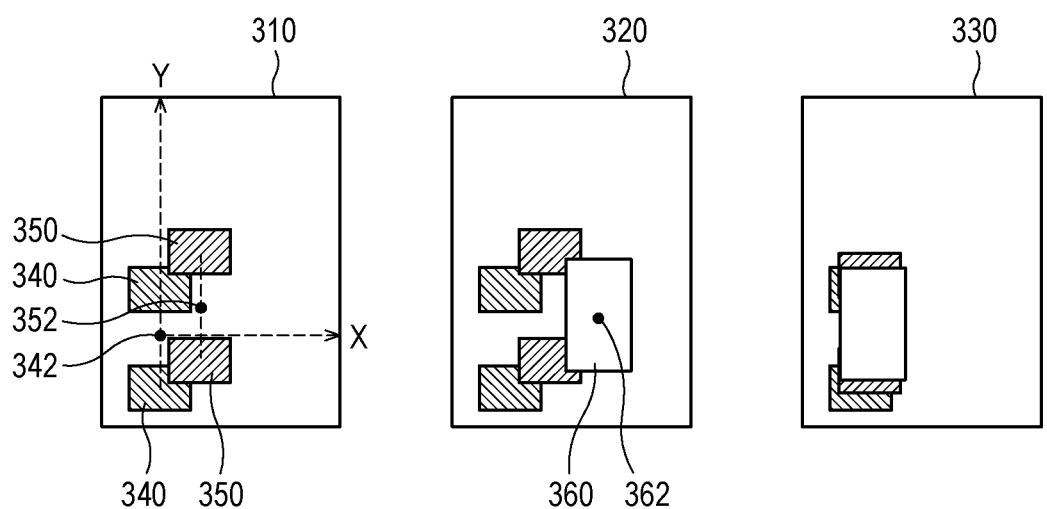
FIG. 3 is a diagram illustrating a pad, a solder and a component on a substrate according to various embodiments of the present disclosure.

FIG. 3 is a diagram illustrating the pads, the solders and the component on the substrate according to various embodiments of the present disclosure. As described above, the pads 340 may be formed on the substrate 310. As described above, the pads 340 may be formed as a pair of electrodes. In one embodiment, the position of the pads 340 may indicate a center point 342 between two pads. In one embodiment, when the substrate 310 is viewed as a coordinate plane, the center point 342 becomes an origin (0, 0), and may serve as a reference point indicating the positions of the solders and the component. Solders 350 may be printed in a corresponding relationship with the pads 340. In one embodiment, the position of the solders 350 may indicate a center point 352 between two solders, more precisely a point at which the centers of mass of the two solders exist. In one embodiment, the state of the solder measured by the first measurement device 130 may include a position offset of the solders with respect to the pads. This position offset may indicate position coordinates, i.e., a two-dimensional vector of the center point 352 of the solders with respect to the center point 342.

The component 360 may be mounted on the substrate 320 on which the solders are printed. In one embodiment, the position of the component 360 may indicate a position of a center point 362 of the component 360. As described above, the state of the component measured by the second measurement device 150 may include a position offset of the mounted component with respect to the pads. This position offset may indicate position coordinates, i.e., a two-dimensional vector of the center point 362 of the component with respect to the center point 342.

The substrate 330 on which the component 360 is mounted may undergo a reflow process. During the reflow process, the positions of the solders 350 and the component 360 may be changed due to the surface tension of the solders 350 and other physical causes generated in the process in which the solders 350 are melted and cured. As described above, the state of the component on the substrate 330 after the reflow process, which is measured by the third measurement device 170, may include a position offset of the component with respect to the pads. This position offset may mean position coordinates, i.e., a two-dimensional vector of the center point 362 of the component with respect to the center point 342 on the substrate 430 after the reflow process. In the present disclosure, as the position offset of one component on the substrate after the reflow process becomes closer to 0, it may be considered that the bonding of the component is successful. In addition, as the variation in position offsets of a plurality of components on the substrate after the reflow process becomes smaller, it may be considered that the bonding of the components is successful.

Figure 4:
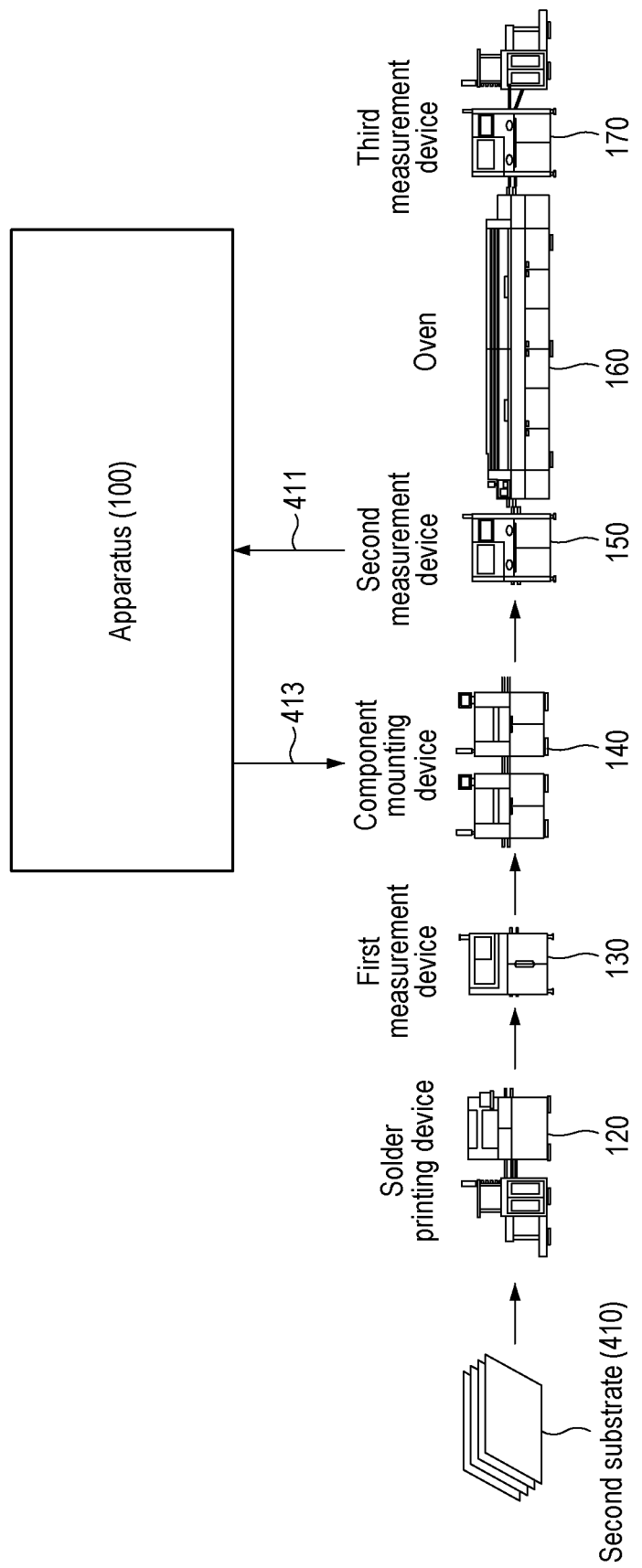
FIG. 4 is a diagram for explaining a process of resetting a range of a normal state according to various embodiments of the present disclosure.

FIG. 4 is a diagram for explaining a process of resetting a range of the normal state for the plurality of position offsets of plurality of components according to various embodiments of the present disclosure. As described above, the apparatus 100 according to various embodiments may acquire the plurality of first position offsets of the plurality of first components respectively mounted on the plurality of first substrates with respect to the plurality of pads of the plurality of first substrates corresponding to the plurality of first components, may set the range of the normal state for the component position offset based on the plurality of first position offsets, and may generate the control signal for adjusting at least one control parameter of the component mounting device 140 associated with the component mounting position based on the set range of the normal state. The apparatus 100 may transmit the generated control signal to the component mounting device 140 to thereby adjust the position where the component mounting device 140 mounts the component on the substrate.

After transmitting the control signal, the apparatus 100 according to various embodiments may determine whether or not a change in a state of the component position offset has occurred. The second measurement device 150 may output a plurality of second position offsets 411 of the plurality of second components respectively mounted on the plurality of second substrates 410 with respect to a plurality of pads of the plurality of second substrates 410 corresponding to the plurality of second components. The apparatus 100 may acquire the plurality of second position offsets 411 from the second measurement device 150. The apparatus 100 may determine whether or not a change in the state of the component position offset has occurred, based on the plurality of second position offsets and the range of the normal state set based on the plurality of first position offsets. The apparatus 100 may check the number of offsets falling outside the range of the normal state among the plurality of second position offsets, and may determine that the change in the state of the component position offset has occurred if the number of offsets falling outside the range of the normal state exceeds a predetermined number. For example, if the number of offsets falling outside the range of the normal state set based on the plurality of first position offsets among the plurality of second position offsets exceeds 10, the apparatus 100 may determine that the change in the state of the component position offset has occurred.

The apparatus 100 according to various embodiments may reset the range of the normal state for the component position offset based on the plurality of second position offsets, in response to the determination that the change in the state of the component position offset has occurred. The apparatus 100 may regenerate a control signal for re-adjusting at least one control parameter of the component mounting device 140 associated with the component mounting position based on the reset range of the normal state. The apparatus 100 may transmit the regenerated control signal 413 to the component mounting device 140. In this case, by determining the mounting position of the component based on the reset range of the normal state, it is possible to optimize the mounting position of the component to be mounted on the next substrate.

Figure 5:
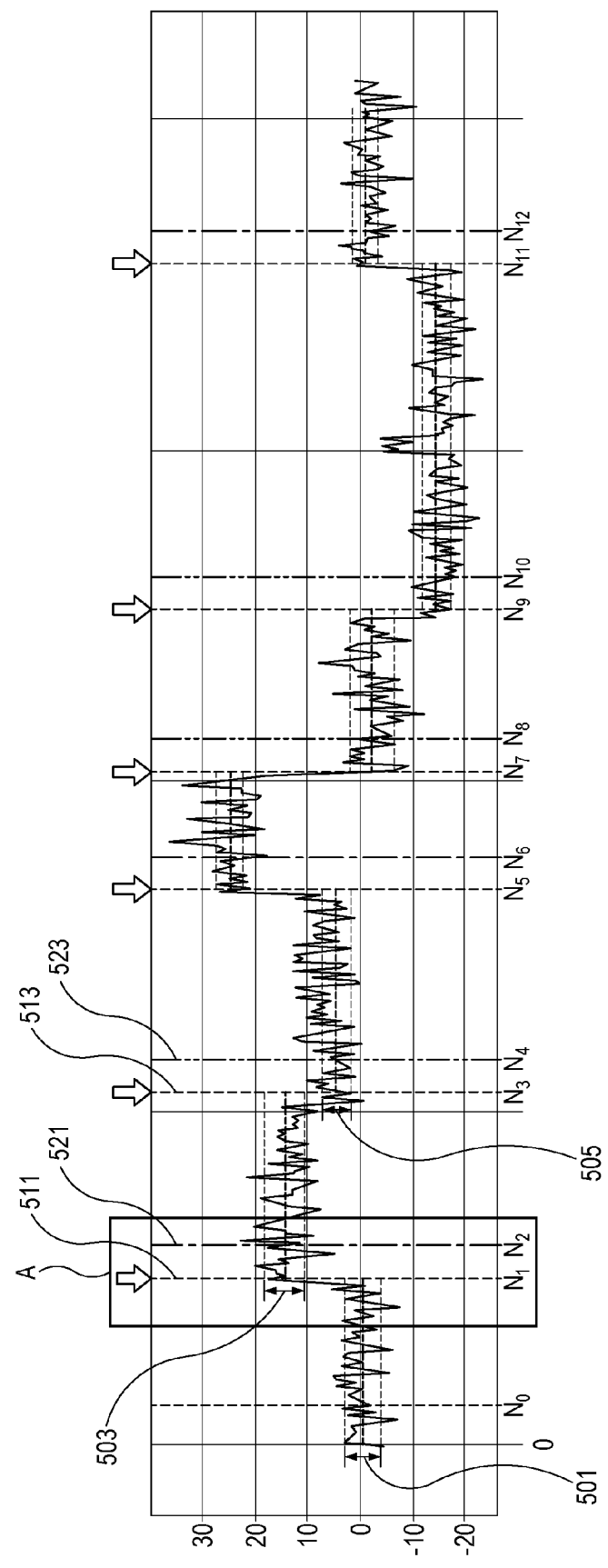
FIG. 5 is a graph illustrating a position offset of a component depending on a substrate order in a substrate processing process according to various embodiments of the present disclosure.

FIG. 5 is a graph illustrating position offsets of components according to the substrate order in a substrate processing process according to various embodiments of the present disclosure. The x-axis of the graph represents the order of the substrate processing process, and the y-axis of the graph may represent a position offset in the x-axis direction or a position offset in the y-axis direction of the component mounted on the substrate with respect to the pad.

The apparatus 100 according to various embodiments may acquire a plurality of first position offsets of the plurality of first components respectively mounted on the plurality of first substrates 110 with respect to the plurality of pads of the plurality of first substrates 110 corresponding to the plurality of first components, from the second measurement device 150. The apparatus 100 may set a range of a normal state for a component position offset based on the plurality of first position offsets. For example, the apparatus 100 may set a range of a normal state 501 for the component position offset based on the position offsets of the components on the $1^{st}$ to $N_0^{-th}$ substrates in the substrate processing process. For example, if the standard deviation value of the position offsets of the components on the $1^{st}$ to $N_0^{-th}$ substrates is 3, the range of the normal state 501 for the component position offset may be set to +3 or more and less than −3 based on the standard deviation value 3. It goes without saying that the range of the normal state 501 is exemplary and may be set in various ways.

The apparatus 100 may generate a control signal for adjusting at least one control parameter of the component mounting device 140 associated with the component mounting position based on the set range of the normal state 501. The control parameter may be a parameter for controlling the component mounting device 140 such that the position offset of the component to be mounted on the next substrate falls within the set range of the normal state 501. The apparatus 100 may transmit the control signal to the component mounting device 140. Accordingly, the apparatus 100 may adjust the control parameter of the component mounting device 140 in real time so that the components can be mounted within the set range of the normal state 501 on the next substrate of the $N_0^{-th}$ substrate. For example, after transmitting the control signal, the apparatus 100 may acquire a position offset of a component mounted on the $K^{-th}$ ($K>N_0$) substrate with respect to a pad of the $K^{-th}$ substrate, may regenerate a control signal for re-adjusting at least one control parameter of the component mounting device 140 based on the set range of the normal state 501 and the acquired position offset of the component mounted on the $K^{-th}$ substrate, and may transmit the regenerated control signal to the component mounting device 140. In the aforementioned case, the component mounting device 140 may mount the component at an optimal mounting position on the $K+a^{-th}$ substrate (where "a" is an integer equal to or greater than 1).

The apparatus 100 according to various embodiments of the present disclosure may determine whether or not a change in a state of the component position offset has occurred. The apparatus 100 may acquire a plurality of second position offsets of a plurality of second components respectively mounted on the plurality of second substrates 410 with respect to a plurality of pads of the plurality of second substrates 410 corresponding to the plurality of second components, from the second measurement device 150. The apparatus 100 may determine whether or not a change in the state of the component position offset has occurred, based on the plurality of second position offsets and the set range of the normal state 501. Referring to the area A of the graph, the component position offset may be largely changed from the $N_1^{-th}$ substrate 511 due to external factors. In the aforementioned case, the apparatus 100 may determine whether or not a change in the state of the component position offset has occurred, based on the position offsets of the components on the $N_1^{-th}$ substrate 511 to the $N_2^{-th}$ substrate 521 and the set range of the normal state 501. For example, if the number of offsets falling outside the set range of the normal state 501 among the position offsets of the components on the $N_1^{-th}$ substrate 511 to the $N_2^{-th}$ substrate 521 exceeds a predetermined number (e.g., 10), the apparatus 100 may determine that a change in the state of the component position offset has occurred, and may generate a control signal for adjusting at least one control parameter of the component mounting device 140.

In response to the determination that the change in the state of the component position offset has occurred, the apparatus 100 according to various embodiments of the present disclosure may reset the range of a normal state 503 for the component position offset based on the plurality of second position offsets. For example, when it is determined that a change in the state of the component position offset has occurred, the apparatus 100 may reset the range of the normal state 503 for the component position offset based on the position offsets of the components on the $N_1^{-th}$ substrate 511 to the $N_2^{-th}$ substrate 521. For example, if the standard deviation value of the position offsets of the components on the $N_1^{-th}$ substrate to the $N_2^{-th}$ substrate is +5, the apparatus 100 may reset the range of the normal state 503 for the component position offset to −5 or more and less than +5.

The apparatus 100 according to various embodiments may regenerate a control signal for re-adjusting at least one control parameter of the component mounting device 140 associated with the component mounting position based on the reset range of the normal state 503. The apparatus 100 may transmit the regenerated control signal to the component mounting device 140. Accordingly, the apparatus 100 may adjust the control parameter of the component mounting device 140 in real time so that the components can be mounted within the reset range of the normal state 503 on the $N_{2+a}^{-th}$ substrate and the subsequent substrates. For example, after transmitting the regenerated control signal, the apparatus 100 may acquire a position offset of the component mounted on an arbitrary $L^{-th}$ ($L > N_2$) substrate with respect to the pads of the $L^{-th}$ substrate, may regenerate a control signal for re-adjusting at least one control parameter of the component mounting device 140 based on the reset range of the normal state 503 and the acquired position offset, and may transmit the regenerated control signal to the component mounting device 140. In this case, the component mounting device 140 may mount the component at an optimal mounting position on the $L_{+a}^{-th}$ substrate.

In the same manner, the apparatus 100 according to various embodiments may continuously determine whether or not a change in the state of the component position offset has occurred. For example, the position offset may be largely changed from the $N_3^{-th}$ substrate 513 due to external factors. In the aforementioned case, the apparatus 100 may determine whether or not a change in the state of the component position offset has occurred, based on the position offsets of the components on the $N_3^{-th}$ substrate 513 to the $N_4^{-th}$ substrate 523 and the reset range of the normal state 503. In response to the determination that a change in the state of the component position offset has occurred, the apparatus 100 may reset the range of a normal state 505 for the position offset of the component based on the position offsets of the components on the $N_3^{-th}$ substrate 513 to the $N_4^{-th}$ substrate 523. Therefore, even if the position offset of the component is largely changed due to external factors, the apparatus 100 according to various embodiments may control the component mounting device 140 so as to mount the component at an optimal mounting position, by adaptively setting a range of a normal state for the changed position offset.

Figure 6:
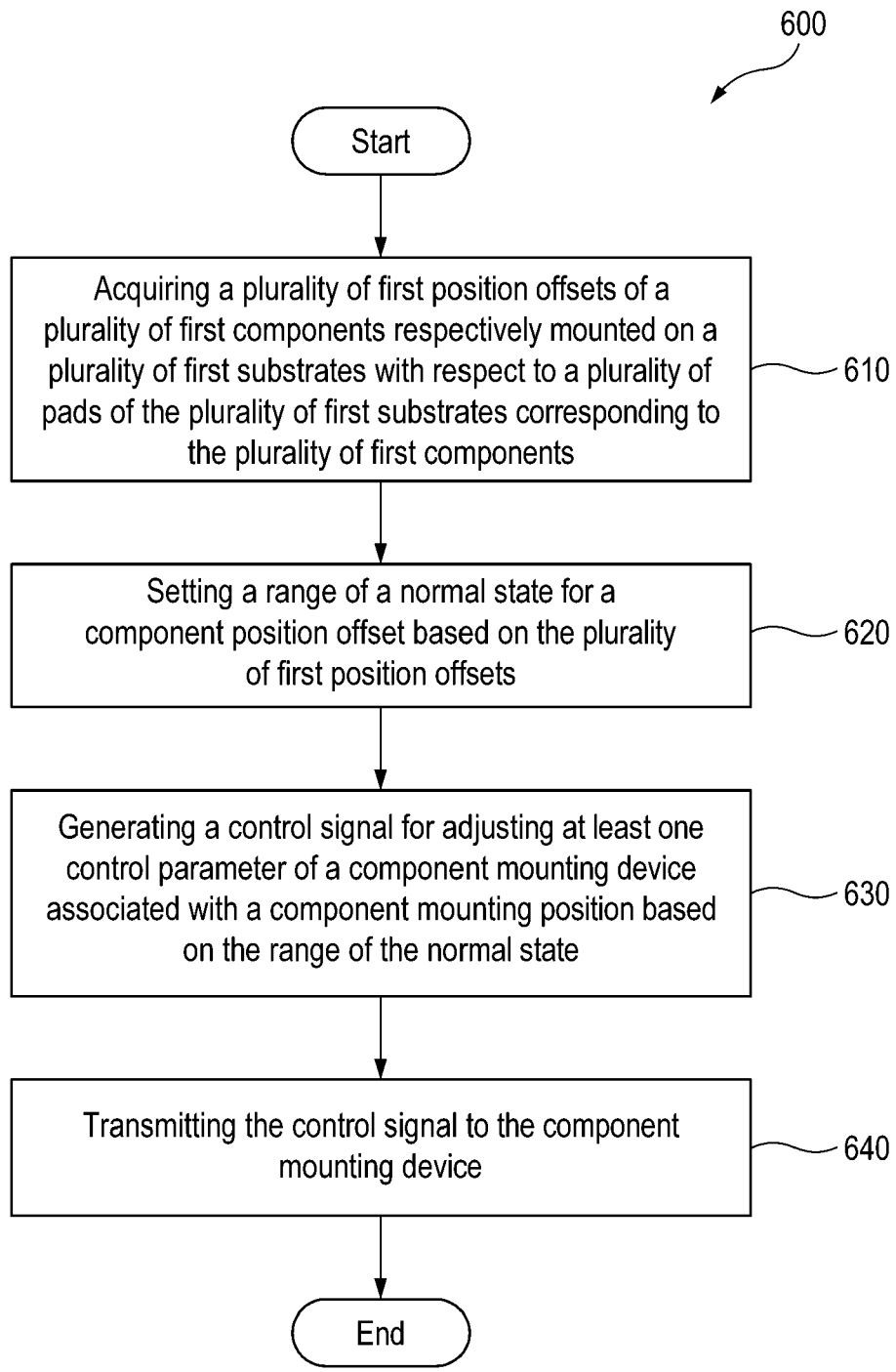
FIG. 6 is a flowchart illustrating an operation of an apparatus according to various embodiments of the present disclosure.

FIG. 6 is a flowchart illustrating the operation of the apparatus according to various embodiments of the present disclosure.

Referring to the operation flowchart 600, at operation 610, the apparatus 100 according to various embodiments of the present disclosure may acquire a plurality of first position offsets of the plurality of first components respectively mounted on a plurality of first substrates (e.g., the plurality of first substrates 110 shown in FIG. 1) with respect to a plurality of pads of the plurality of first substrates corresponding to the plurality of first components, from an optical measurement device (e.g., the second measurement device 150 shown in FIG. 1).

At operation 620, the apparatus 100 according to various embodiments of the present disclosure may set a range of a normal state for a component position offset based on the plurality of first position offsets. For example, the apparatus 100 may determine a range of a normal state based on a standard deviation value of the plurality of first position offsets. For example, the apparatus 100 may determine a range of a normal state based on a maximum value and a minimum value among the plurality of first position offsets. For example, the apparatus 100 may determine a range of a normal state based on the offsets excluding the maximum value and the minimum value among the plurality of first position offsets. For example, the apparatus 100 may determine a range of a normal state based on a standard deviation of the offsets excluding the maximum value and the minimum value among the plurality of first position offsets.

At operation 630, the apparatus 100 according to various embodiments may generate a control signal for adjusting at least one control parameter of the component mounting device 140 associated with a component mounting position based on the set range of the normal state. The control parameter may be a parameter for controlling the component mounting device 140 such that a position offset of a component to be mounted on the next substrate falls within the set range of the normal state. The control parameter may include, for example, at least one of a control parameter for adjusting the insertion position of the component mounting device 140 in the width direction, a control parameter for adjusting the insertion position of the component mounting device 140 in the longitudinal direction, and a control parameter for adjusting the insertion angle of the component mounting device 140.

At operation 640, the apparatus 100 according to various embodiments may transmit the generated control signal to the component mounting device 140. The component mounting device 140 may mount a component on a substrate to be subjected to a substrate processing process after the plurality of first substrates, based on the control signal.

Figure 7:
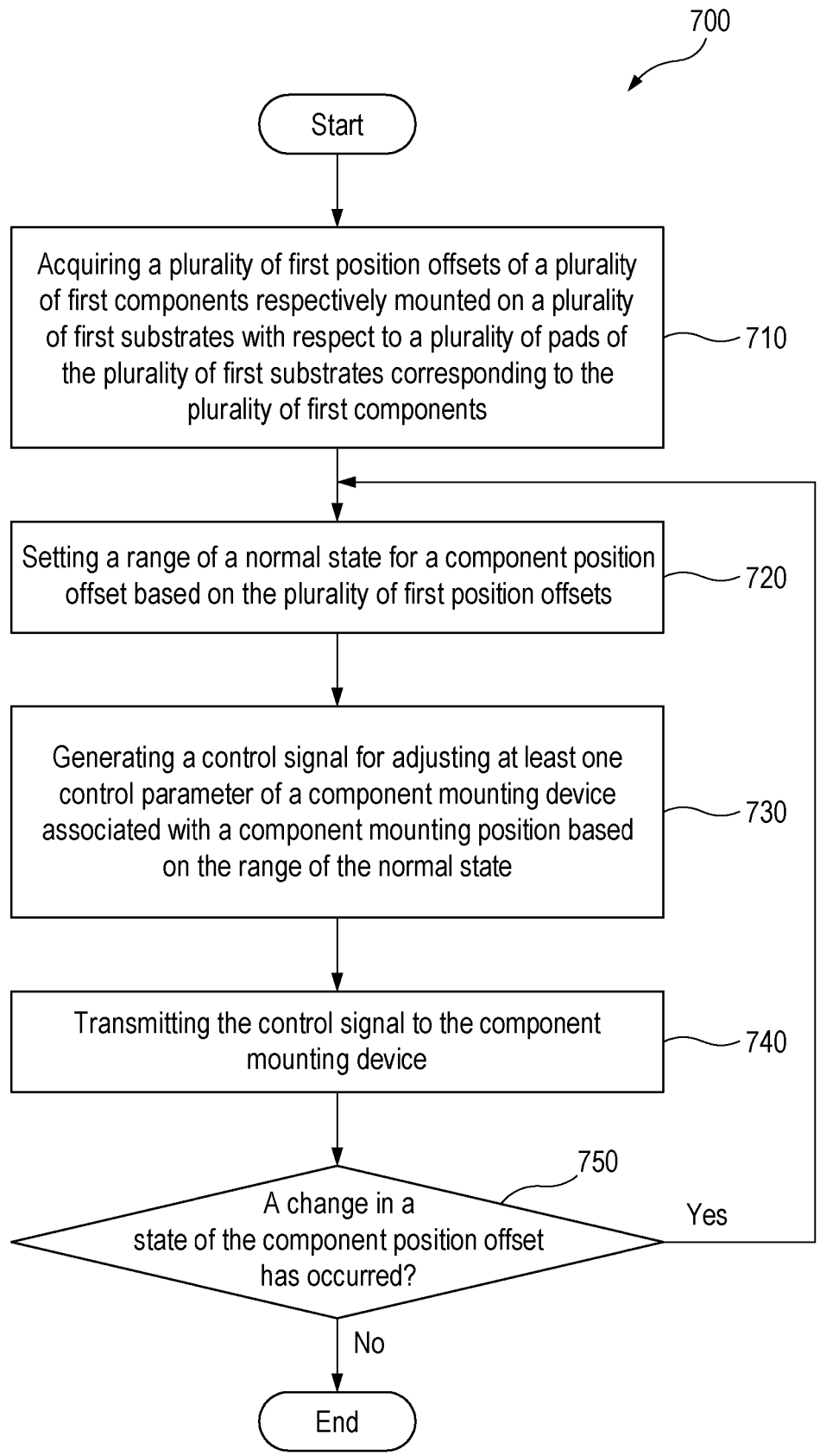
FIG. 7 is a flowchart illustrating an operation of an apparatus according to various embodiments of the present disclosure.

FIG. 7 is a flowchart illustrating the operation of the apparatus according to various embodiments of the present disclosure. The description of contents overlapping with those described with reference to FIG. 6 will be omitted.

Referring to the operation flowchart 700, at operation 710, the apparatus 100 according to various embodiments may acquire a plurality of first position offsets of a plurality of first components respectively mounted on a plurality of first substrates (e.g., the plurality of first substrates 110 shown in FIG. 1) with respect to a plurality of pads of the plurality of first substrates corresponding to the plurality of first components, from an optical measurement device (e.g., the second measurement device 150 shown in FIG. 1).

At operation 720, the apparatus 100 according to various embodiments may set a range of a normal state for a component position offset based on the plurality of first position offsets.

At operation 730, the apparatus 100 according to various embodiments may generate a control signal for adjusting at least one control parameter of the component mounting device 140 associated with a component mounting position based on the set range of the normal state.

At operation 740, the apparatus 100 according to various embodiments may transmit the generated control signal to the component mounting device 140.

At operation 750, the apparatus 100 according to various embodiments may determine whether a change in the state of the component position offset has occurred. For example, after transmitting the control signal, the apparatus 100 may acquire a plurality of second position offsets of a plurality of second components respectively mounted on a plurality of second substrates (e.g., the plurality of second substrates 410 shown in FIG. 4) with respect to a plurality of pads of the plurality of second substrates corresponding to the plurality of second components, from an optical measurement device, and may determine whether or not a change in a state of the component position offset has occurred, based on the plurality of second position offsets and the set range of the normal state.

When it is determined that a change in the state of the component position offset has occurred, the process may return to operation 720 (Yes in operation 750) to reset the range of the normal state for the component position offset based on the plurality of second position offsets. In the aforementioned case, the apparatus 100 may regenerate a control signal for adjusting the control parameter of the component mounting device 140 associated with the component mounting position based on the reset range of the normal state, and may transmit the regenerated control signal to the component mounting device 140.

In this way, the apparatus 100 can generate a control parameter based on the position offset for at least one component, and can flexibly respond to a change in the state of the position offset of a large number of components to generate a control parameter by resetting a range of a normal state in real time.

Although the method has been described through specific embodiments, the method may also be implemented as computer-readable codes on a computer-readable recording medium. The computer-readable recording medium includes all types of recording devices which store data that can be read by a computer system. Examples of the computer-readable recording medium may include a ROM, a RAM, a CD-ROM, a magnetic tape, a floppy disk, an optical data storage device, and the like. In addition, the computer-readable recording medium may be distributed over computer systems connected through a network. Computer-readable codes may be stored in the computer-readable recording medium in a distributed manner and may be executed. In addition, functional programs, codes and code segments for implementing the above embodiments can be easily inferred by programmers in the technical field to which the present disclosure belongs.

According to various embodiments of the present disclosure, it is possible to determine an accurate component mounting condition by adaptively considering the states of position offsets acquired during a substrate processing process. For example, it is possible to determine a component mounting position such that the position offset of a component relative to pads is minimized.

According to various embodiments of the present disclosure, it is possible to optimize at least one control parameter of a component mounting device associated with a mounting position of a component.

According to various embodiments of the present disclosure, it is possible to determine a mounting position of a component in real time using a small amount of data.

While the technical idea of the present disclosure has been described above with reference to some embodiments and examples shown in the accompanying drawings, it should be noted that various substitutions, modifications and changes may be made without departing from the spirit and scope of the present disclosure that can be understood by those of ordinary skill in the art to which the present disclosure belongs. In addition, such substitutions, modifications and changes are to be considered as falling within the scope of the appended claims.

What is claimed is:

1. An apparatus configured to communicate with a component mounting device for mounting at least one component on at least one pad of each of a plurality of substrates and an optical measurement device for measuring positions of the at least one component mounted on each of the plurality of substrates transferred from the component mounting device, comprising:
   one or more processors; and
   one or more memories operatively connected to the one or more processors,
   wherein the one or more memories store instructions that, when executed, cause the one or more processors to:
   acquire a plurality of first position offsets of a plurality of first components respectively mounted on a plurality of first substrates with respect to a plurality of pads of the plurality of first substrates corresponding to the plurality of first components from the optical measurement device;
   set a range of a normal state for a component position offset based on the plurality of first position offsets;
   generate a control signal for adjusting at least one control parameter of the component mounting device associated with a component mounting position based on the range of the normal state; and
   transmit the control signal to the component mounting device.

2. The apparatus of claim 1, wherein the instructions are configured to cause the one or more processors to:
   acquire, after transmitting the control signal, a plurality of second position offsets of a plurality of second components respectively mounted on a plurality of second substrates with respect to a plurality of pads of the plurality of second substrates corresponding to the plurality of second components from the optical measurement device; and
   determine whether or not a change in a state of the component position offset has occurred, based on the plurality of second position offsets and the range of the normal state set based on the plurality of first position offsets.

3. The apparatus of claim 2, wherein the instructions are configured to cause the one or more processors to, in response to a determination that the change in the state of the component position offset has occurred, reset the range of the normal state for the component position offset based on the plurality of second position offsets.

4. The apparatus of claim 3, wherein the instructions are configured to cause the one or more processors to:
   regenerate a control signal for re-adjusting the at least one control parameter of the component mounting device associated with the component mounting position based on the reset range of the normal state; and
   transmit the regenerated control signal to the component mounting device.

5. The apparatus of claim 2, wherein the instructions are configured to cause the one or more processors to:
   check a number of offsets falling outside the range of the normal state among the plurality of second position offsets; and
   determine that a change in the state of the component position offset has occurred, when the number of offsets falling outside the range of the normal state exceeds a predetermined number.

6. The apparatus of claim 1, wherein the instructions are configured to cause the one or more processors to:
   acquire, after transmitting the control signal, a third position offset of a third component mounted on a third substrate with respect to a pad of the third substrate from the optical measurement device;

regenerate a control signal for re-adjusting the at least one control parameter of the component mounting device based on the range of the normal state and the third position offset; and transmit the regenerated control signal to the component mounting device.

7. The apparatus of claim 1, wherein the at least one control parameter of the component mounting device includes at least one of a control parameter for adjusting an insertion position of the component mounting device in a width direction, a control parameter for adjusting an insertion position of the component mounting device in a longitudinal direction, and a control parameter for adjusting an insertion angle of the component mounting device.

8. The apparatus of claim 1, further comprising:
a communication circuit configured to communicate with the component mounting device and the optical measurement device.

9. A method performed by an apparatus configured to communicate with a component mounting device for mounting at least one component on at least one pad of each of a plurality of substrates and an optical measurement device for measuring positions of the at least one component mounted on each of the plurality of substrates transferred from the component mounting device, comprising:
acquiring a plurality of first position offsets of a plurality of first components respectively mounted on a plurality of first substrates with respect to a plurality of pads of the plurality of first substrates corresponding to the plurality of first components from the optical measurement device;
setting a range of a normal state for a component position offset based on the plurality of first position offsets;
generating a control signal for adjusting at least one control parameter of the component mounting device associated with a component mounting position based on the range of the normal state; and
transmitting the control signal to the component mounting device.

10. The method of claim 9, further comprising:
acquiring, after transmitting the control signal, a plurality of second position offsets of a plurality of second components respectively mounted on a plurality of second substrates with respect to a plurality of pads of the plurality of second substrates corresponding to the plurality of second components from the optical measurement device; and
determining whether or not a change in a state of the component position offset has occurred, based on the plurality of second position offsets and the range of the normal state set based on the plurality of first position offsets.

11. The method of claim 10, further comprising:
in response to a determination that a change in the state of the component position offset has occurred, resetting the range of the normal state for the component position offset based on the plurality of second position offsets.

12. The method of claim 11, further comprising:
regenerating a control signal for re-adjusting the at least one control parameter of the component mounting device associated with the component mounting position based on the reset range of the normal state; and
transmitting the regenerated control signal to the component mounting device.

13. The method of claim 10, wherein the operation of determining includes:
checking a number of offsets falling outside the range of the normal state among the plurality of second position offsets; and
determining that a change in the state of the component position offset has occurred, when the number of offsets falling outside the range of the normal state exceeds a predetermined number.

14. The method of claim 9, further comprising:
acquiring, after transmitting the control signal, a third position offset of a third component mounted on a third substrate with respect to a pad of the third substrate from the optical measurement device;
regenerating a control signal for re-adjusting the at least one control parameter of the component mounting device based on the range of the normal state and the third position offset; and
transmitting the regenerated control signal to the component mounting device.

15. The method of claim 9, wherein the at least one control parameter of the component mounting device includes at least one of a control parameter for adjusting an insertion position of the component mounting device in a width direction, a control parameter for adjusting an insertion position of the component mounting device in a longitudinal direction, and a control parameter for adjusting an insertion angle of the component mounting device.

16. A non-transitory computer-readable recording medium that records instructions for causing one or more processors to, when the instructions are executed by the one or more processors, perform an operation of communicating with a component mounting device for mounting at least one component on at least one pad of each of a plurality of substrates and an optical measurement device for measuring positions of the at least one component mounted on each of the plurality of substrates transferred from the component mounting device,
wherein the instructions are configured to cause the one or more processors to:
acquire a plurality of first position offsets of a plurality of first components respectively mounted on a plurality of first substrates with respect to a plurality of pads of the plurality of first substrates corresponding to the plurality of first components from the optical measurement device;
set a range of a normal state for a component position offset based on the plurality of first position offsets;
generate a control signal for adjusting at least one control parameter of the component mounting device associated with a component mounting position based on the range of the normal state; and
transmit the control signal to the component mounting device.

17. The recording medium of claim 16, wherein the instructions are configured to cause the one or more processors to:
acquire, after transmitting the control signal, a plurality of second position offsets of a plurality of second components respectively mounted on a plurality of second substrates with respect to a plurality of pads of each of the plurality of second substrates corresponding to the plurality of second components from the optical measurement device, and
determine whether or not a change in a state of the component position offset has occurred, based on the plurality of second position offsets and the range of the normal state set based on the plurality of first position offsets.

18. The recording medium of claim 17, wherein the instructions are configured to cause the one or more processors to, in response to a determination that a change in the state of the component position offset has occurred, reset the range of the normal state for the component position offset based on the plurality of second position offsets.

19. The recording medium of claim 18, wherein the instructions are configured to cause the one or more processors to:
- regenerate a control signal for re-adjusting the at least one control parameter of the component mounting device associated with the component mounting position based on the reset range of the normal state, and
- transmit the regenerated control signal to the component mounting device.

20. The recording medium of claim 17, wherein the instructions are configured to cause the one or more processors to:
- check a number of offsets falling outside the range of the normal state among the plurality of second position offsets, and
- determine that a change in the state of the component position offset has occurred, when the number of offsets falling outside the range of the normal state exceeds a predetermined number.

* * * * *